United States Patent [19]
Iwamoto et al.

[11] Patent Number: 6,156,153
[45] Date of Patent: Dec. 5, 2000

[54] CHEMICAL TREATMENT APPARATUS AND CHEMICAL TREATMENT METHOD

[75] Inventors: Hayato Iwamoto, Kanagawa; Kiyoshi Kurosawa, Saitama, both of Japan

[73] Assignee: Sony Corporation, Tokyo, Japan

[21] Appl. No.: 09/158,572

[22] Filed: Sep. 22, 1998

[30] Foreign Application Priority Data

Sep. 30, 1997 [JP] Japan ................................. 9-265275

[51] Int. Cl.$^7$ .............................. C23F 1/02; H01L 21/302
[52] U.S. Cl. ................................ 156/345; 438/745; 134/2; 134/24; 134/55
[58] Field of Search ............................. 438/745; 134/2, 134/55, 24; 156/345

[56] References Cited

U.S. PATENT DOCUMENTS

| | | | |
|---|---|---|---|
| 5,315,793 | 5/1994 | Peterson et al. ......................... 51/415 |
| 5,651,836 | 7/1997 | Suzuk ..................................... 134/34 |
| 5,782,990 | 7/1998 | Murakami et al. ....................... 134/26 |
| 5,922,138 | 7/1999 | Shindo et al. ............................. 134/2 |

*Primary Examiner*—William Powell
*Assistant Examiner*—Lynette T. Umez-Eronini
*Attorney, Agent, or Firm*—Ronald P. Kananen; Rader, Fishman & Grauer

[57] ABSTRACT

A chemical treatment apparatus including a treatment tank filled with chemical with which wafers are treated, and a jet pipe having chemical jetting holes which is provided at the bottom portion of the treatment tank and jets the chemical from the jetting holes thereof, the jetting holes containing at least first jetting holes for jetting the chemical upwardly and second jetting holes for jetting the chemical in a direction different from that of the first holes. The second direction is set to a direction within the range from the horizontal direction of the jet pipe to the obliquely downward direction at 45 degrees with respect to the horizontal direction.

41 Claims, 3 Drawing Sheets

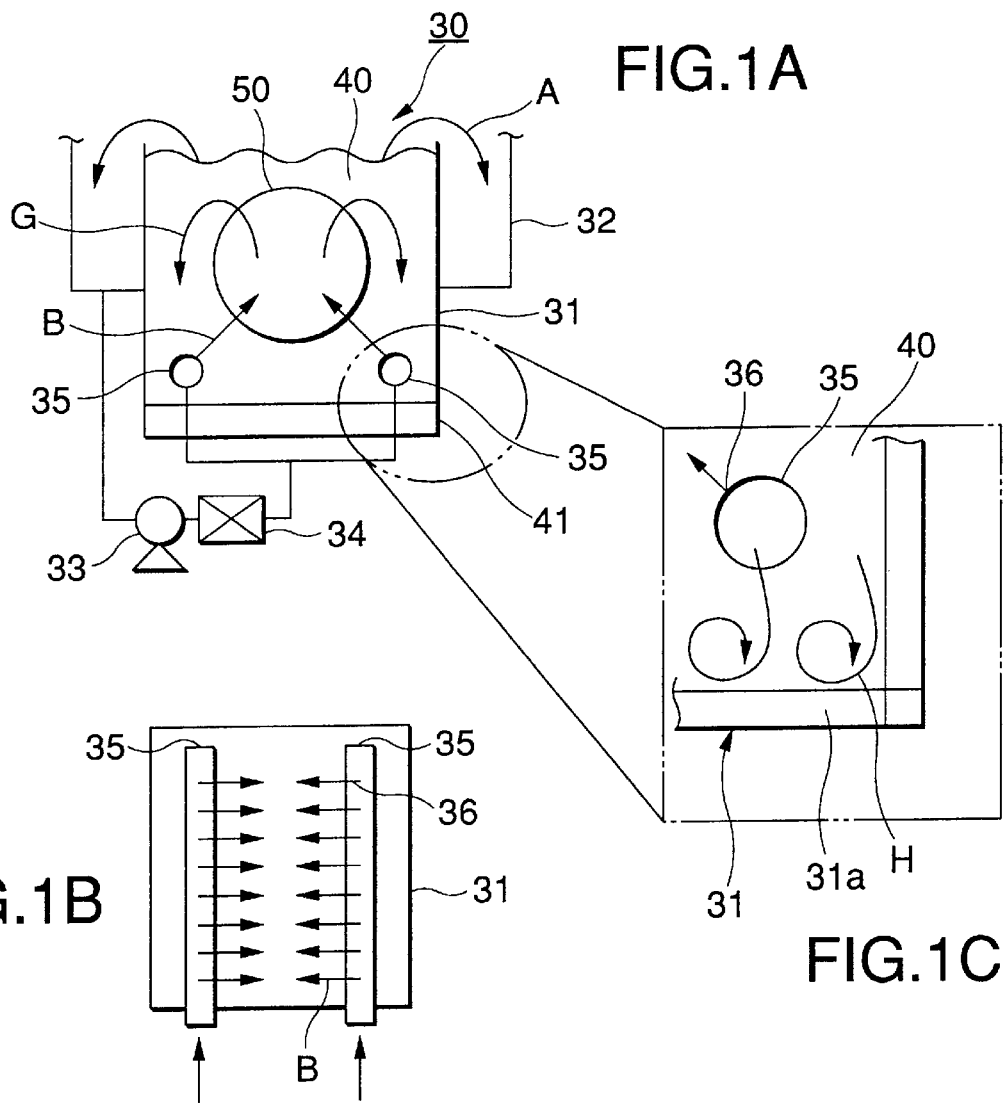

FIG.3
| SCHEMATIC DIAGRAM OF DISCHARGING HOLE | ETCHING UNIFORMITY (RESULT IN THE CASE OF 8 INCHES) |
|---|---|
| FIRST DIRECTION : NUMBER OF HOLES = 50<br>SECOND DIRECTION : NUMBER OF HOLES = 5<br>THIRD DIRECTION : NUMBER OF HOLES = 5 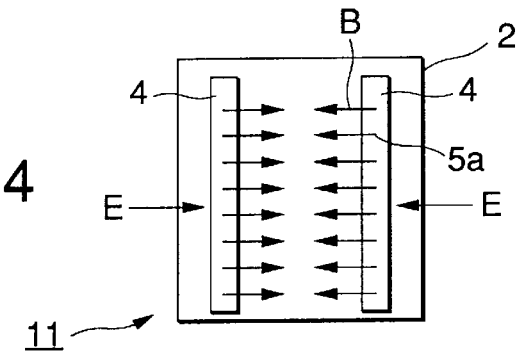 | 4.13% |
| FIRST DIRECTION : NUMBER OF HOLES = 50 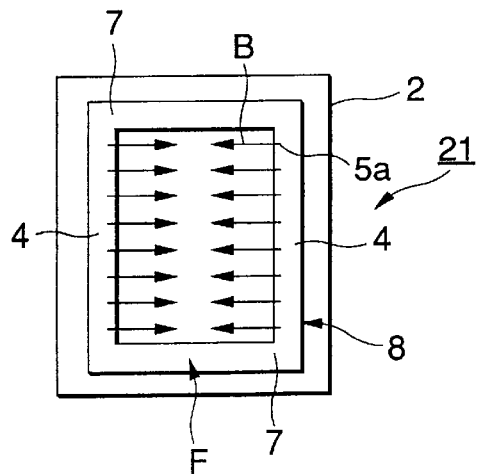 | 5.73% |
FIG.4
FIG.5

CHEMICAL TREATMENT APPARATUS AND CHEMICAL TREATMENT METHOD

BACKGROUND OF THE INVENTION

The present invention relates to a chemical treatment apparatus and a chemical treatment method, and more particularly to a chemical treatment apparatus and a chemical treatment method which are applied to a cleaning treatment step and an etching step in a semiconductor device manufacturing process.

A wafer treatment using chemical has been hitherto performed in each process of a semiconductor device manufacturing field. For example, in a semiconductor wafer manufacturing process, such a wafer treatment is performed in a cleaning step for removing unneeded materials (contaminants) adhering to the surfaces of wafers, in a wet etching step of a process for forming semiconductor devices on wafers, etc. As the microstructure of semiconductor devices is finer, not only the cleaning effect, but also uniformity of wet etching are required to be more remarkably enhanced.

A dip treatment in which plural wafers to be treated (hereinafter referred to as "target wafer") are dipped into chemical all together is known as a typical chemical treatment method.

FIGS. 1A to 1C are diagrams showing a conventional chemical treatment apparatus using the dip treatment method. A chemical treatment apparatus 30 includes a nozzle type circulating treatment tank 31. As shown in FIG. 1A, chemical 40 is overflowed in the direction indicated by an arrow A from the treatment tank 31 into an outer tank 32 which is provided at the outer periphery of the treatment tank 31, and contaminant materials in the chemical 40 are discharged into the outer tank 32 together with the chemical 40. Thereafter, the chemical 40 in the outer tank 32 is guided through a pump 33 to a filter 34 in which the chemical 40 is filtered and cleaned, and then supplied into the treatment tank 31 again.

At this time, in order to effectively bring the chemical 40 into contact with the surface of a target wafer 50 dipped in the chemical 40 in the treatment tank 31, the chemical 40 is fed from the filter 34 to jet pipes 35 serving as nozzles which are provided at the bottom side in the treatment tank 31, and supplied into the treatment tank 31 through small jetting holes 36 formed on the jet pipes 35.

In the dip treatment, plural target wafers 50 are normally dipped in the chemical 40 while being arranged substantially in parallel and at predetermined intervals. Therefore, a pair of jet pipes 35 are disposed in the chemical treatment tank 30 so as to confront each other. The plural target wafers 50 are dipped between the jet pipes 35 and above the jet pipes 35 so that the arrangement direction of the target wafers 50 is substantially parallel to the length direction of the jet pipes 35. The jet holes 36 are formed in each jet pipe 35 so that the chemical 40 is jetted to the gaps between neighboring target wafers 50 and to the substantial centers of the target wafers 50 (in the directions indicated by arrows B of FIGS. 1A and 1B). These plural jet holes 36 are formed in each jet pipe 35 along the length direction of the jet pipe 35.

However, in the chemical treatment using the chemical treatment apparatus 30 shown in FIG. 1, all of the chemical 40 jetted from the jet pipes 35 does not necessarily flow upwardly and overflow from the treatment tank 31 into the outer tank 32, but a part of the chemical 40 convectively returns from the upper side of the target wafer 50 toward the jet pipes 35 as indicated by an arrow G in FIG. 1A. The chemical 40 which returns to the portions surrounding the jet pipes 35 contains various contaminant materials removed from the target wafer 50, and stagnates in the neighborhood of the bottom portion 31a of the treatment tank 31 as indicated by an arrow H in FIG. 1C, so that a dirty stagnant layer 41 is formed in the neighborhood of the bottom portion 31a. The chemical 40 stagnates in the neighborhood of the bottom portion 31a of the treatment tank 31 as described above because there is not provided any means of inducing flow of the chemical 40 in the neighborhood of the jet pipes 35, particularly in the neighborhood of the bottom portion 31a of the treatment layer 31 which is at the lower side of the jet pipes 35.

When the stagnant layer 41 as described above is formed, the circulating efficiency of the chemical 40 in the treatment tank 31 is lowered. As a result, for example when the chemical treatment is a water washing treatment after the wet etching step, a large amount of wet etching agent to be removed remains ununiformly on the surface of the target wafer 50, and thus the uniformity of the etching in the plane of the target wafer 50 is deteriorated. Further, the lowering of the circulating efficiency of the chemical 40 reduces the washing effect of the target wafer 50, and the contaminant materials taken into the chemical 40 also adhere to the surface of the target wafer 50 again. if semiconductor devices are manufactured while the target wafers 50 are left contaminated, the electrical reliability and the manufacturing yield of the semiconductor devices are reduced.

Further, in order to remove the stagnant layer 41, the treatment tank 31 must frequently washed, and the chemical 40 being used must be more frequently exchanged. Therefore, the following various troubles occur: a large amount of labor is imposed on a maintenance work; the manufacturing cost rises; the manufacturing yield is reduced because the workability of the chemical treatment apparatus 30 is reduced, etc.

SUMMARY OF THE INVENTION

Therefore, in order to solve the above problems, a chemical treatment apparatus according to the present invention is characterized in that a jet pipe provided at the bottom portion in a treatment tank contains at least first holes for jetting chemical upwardly and second holes for jetting chemical in a direction different from that of the first holes.

According to the chemical treatment apparatus of the present invention, the jet holes of the jet pipe comprise the first holes for jetting the chemical upwardly and the second holes for jetting the chemical in the direction different from the jet direction of the first holes. Therefore, for example when a target wafer is disposed above the jet pipes in the treatment tank and the first holes are set to jet the chemical toward the substantial center of the target wafer while the second holes are set to jet the chemical toward the bottom portion of the treatment tank which is at the lower side of the target wafer, there are formed not only a chemical flow directing from the substantial center of the target wafer to the upper side, but also a chemical flow directing to the bottom portion in the treatment tank. Accordingly, even when the chemical convectively returns from the upper side of the target wafer to the vicinity of the jet pipes, the chemical is prevented from stagnating at the bottom side of the treatment tank by the chemical flow directing to the bottom side of the treatment tank, and thus no stagnant layer occurs at the bottom side. Therefore, the chemical efficiently flows in the treatment tank. Further, since no stagnant layer is formed, it is unnecessary to frequently perform a cleaning work of the treatment tank and an exchange work of the chemical.

According to the chemical treatment apparatus of the present invention, the etching uniformity when the wet etching is performed can be remarkably enhanced, and also the overall surface of the target wafer can be uniformly and sufficiently cleaned when the cleaning treatment is performed, so that the stable chemical treatment can be performed. Further, the contaminant materials in the chemical can be greatly suppressed from adhering to the surface of the target wafer again. In addition, since no stagnant layer is formed, the labor needed to clean the treatment tank and exchange the chemical can be greatly reduced. Further, the lifetime of the chemical being used is expected to be lengthened, and the cost can be reduced because of the long lifetime of the chemical and much attention can be paid to the environmental pollution because the total use amount of the chemical is reduced.

Further, a chemical treatment method according to the present invention is characterized in that when chemical is filled in a treatment tank and the chemical is jetted from the lower side of a target wafer to treat the target wafer while the target wafer is dipped in the treatment tank, the chemical is jetted in at least two directions, one of which is a first direction to the target wafer and the other of which is a second direction different from the first direction.

According to the chemical treatment method of the present invention, when the target wafer is treated, the chemical is jetted from at least the two directions, that is, the first direction to the target wafer and the second direction which is different from the first direction. Therefore, if the second direction is set to the direction in which the chemical is jetted to the bottom side of the treatment tank, even when the chemical convectively returns from the upper side of the target wafer to the vicinity of the chemical jetting portion, the returning chemical can be prevented from stagnating at that position because the chemical is made to flow out by the chemical flow directing to the bottom side of the treatment tank (i.e., the chemical flowing in the second direction). Accordingly, no stagnant layer of the chemical is formed at the bottom side of the treatment tank, and the target wafer can be treated with the chemical which efficiently flows in the treatment tank. Further, since no stagnant layer is formed, it is unnecessary to frequently perform the cleaning work of the treatment tank and the chemical exchanging work.

BRIEF DESCRIPTION OF THE DRAWINGS

FIGS. 1A to 1C show a conventional chemical treatment apparatus, wherein FIG. 1A is a diagram showing the construction of the conventional chemical treatment apparatus, FIG. 1B is an enlarged view of the main part of the apparatus shown in FIG. 1A, and FIG. 1C is a plan view showing the main part of the apparatus shown in FIG. 1A;

FIGS. 2A and 2B show a first embodiment of a chemical treatment apparatus according to the present invention, wherein FIG. 2A is a diagram showing the construction of the apparatus and FIG. 2B is an enlarged view showing the main part of the apparatus shown in FIG. 2A;

FIG. 3 is a diagram showing a result of etching uniformity when a wet etching process using the chemical treatment apparatus of the first embodiment is performed;

FIG. 4 is a plan view showing the main part of a second embodiment of the chemical treatment apparatus according to the present invention; and FIG. 5 is a plan view showing the main part of a third embodiment of the chemical treatment apparatus according to the present invention.

DETAILED DESCRIPTION OF THE PREFERRED EMBODIMENTS

Figures 2A, 2B:
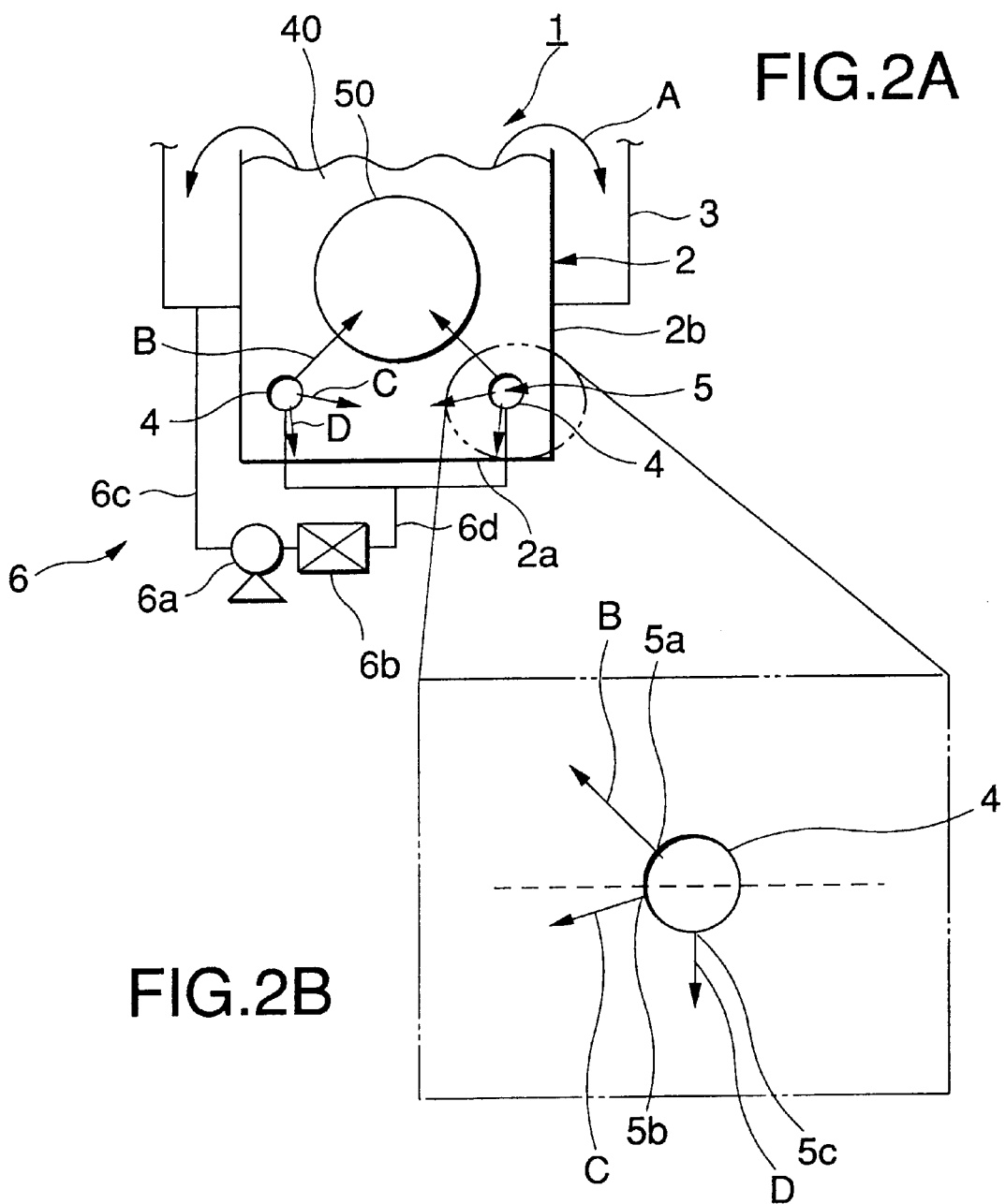

Preferred embodiments according to the present invention will be described hereunder with reference to the accompanying drawings.

FIGS. 2A and 2B show a first embodiment of a chemical treatment apparatus according to the present invention. FIG. 2A is a diagram showing the construction of the chemical treatment apparatus, and FIG. 2B is an enlarged view showing the main part of the chemical treatment apparatus shown in FIG. 2A. FIG. 2A shows a treatment state that a wafer to be treated (target treatment) is dipped in a treatment tank.

As shown in FIG. 2A, in the chemical treatment apparatus 1, plural target wafers 50 are dipped in chemical 40 to subject the surfaces of the target wafers 50 to a chemical treatment while the chemical 40 is overflowed from a treatment tank 2. The chemical treatment apparatus 1 of this embodiment includes the treatment tank 2, an outer tank 3, jet pipes 4 having chemical jetting holes 5, and a supply unit 6. In this specification, the chemical 40 means liquid chemicals which are used in a chemical treatment process of a semiconductor manufacturing process. As the chemical 40 are used pure water, ammonium peroxide water, hydrochloric peroxide water, sulfuric peroxide water, rare hydrofluoric acid, buffer hydrofluoric acid, fuming nitric acid, phosphoric acid, organic solvent, etc.

The treatment tank 2 is filled with the chemical 40, and it is constructed by a bottom portion 2a and a side wall portion 2b erecting from the peripheral edge of the bottom portion 2a so as to have a substantially rectangular section on a plane. The outer tank 3 is used to receive the chemical 40 overflowing from the treatment tank 2, and it is disposed at the upper portion of the treatment tank 2 along the outer periphery of the treatment tank 2.

Each of the jet pipes 4 comprises a so-called nozzle pipe for jetting the chemical 40 through the jetting holes 5, and is disposed at the bottom portion 2a of the treatment tank 2. Here, the jetting pipes 4 are paired with each other so as to confront each other as in the case of the conventional chemical treatment tank, and one end of each jet pipe 4 is connected to the supply portion 6. The jetting holes 5 of each jet pipe 4 contain at least first holes 5a for jetting the chemical 40 upwardly and second holes 5b for jetting the chemical 40 in a direction different from that of the first holes 5a.

In the chemical treatment using the chemical treatment apparatus 1, as in the case of the normal dip chemical treatment, plural target wafers 50 are accommodated in a carrier while arranged substantially in parallel and at predetermined intervals, and dipped in the chemical 40 every carrier. At this time, the target wafers 50 are dipped between the jet pipes 4 so that the arrangement direction of the target wafers 50 is substantially parallel to the length direction of the jet pipes 4 and the target wafers 50 are located above the pair of the jet pipes 4.

Accordingly, in the first embodiment, the first holes 5a are formed so that the chemical 40 is jetted inwardly (i.e., to the inside of the pair of jet pipes 4, that is, to the same side at which the target wafers 50 are located) and in the direction to the center of each target wafer 50 located above the pair of jet pipes 4 (hereinafter referred to as "first direction B"). Further, the second holes 5b are formed so that the chemical 40 is jetted inwardly (i.e., to the inside of the pair of jet pipes 4) and in an obliquely downward direction with respect to the horizontal direction of the jet pipes 4 (indicated by a broken line of FIG. 2B) (hereinafter referred to as "second direction C"). That is, the chemical flow in the second direction C corresponds to a chemical flow which directs to the bottom portion 2a of the treatment tank 2 at the lower side of the confronting jet pipes 4 below the target wafers 50.

In the first embodiment, each jet pipe 4 further contains third jetting holes 5c for jetting the chemical 40 substantially directly below each jet pipe 4 (hereinafter referred to as "third direction D"). That is, each jet pipe 4 has the third holes 5c for jetting the chemical 40 from the just lower side of the jet pipe 4 to the bottom portion 2a of the treatment tank 2.

The first holes 5a are used to jet the chemical 40 for treating the surfaces of the target wafers 50 in the first direction B to form flow of the chemical 40 between the target wafers 50 and between the target wafers 50 and the side wall portion 2b of the treatment tank 2. Accordingly, the number of the first holes 5a which are formed along the length direction of each jet pipe 4 is set to be larger than the number of the target wafers 50 which are dipped at a time in the treatment tank 2 for the chemical treatment. In this embodiment, for example, fifty first holes 5a are formed in each jet pipe 4. Further, the diameter of each first hole 5a is preferably set to about 1.0 mm to 2.0 mm to obtain an excellent linear flow rate.

Further, the second holes 5b are used to form flow of the chemical 40 in the neighborhood of the bottom portion 2a of the treatment tank 2 which is located below the target wafers 50. Accordingly, the second direction C in which the chemical 40 is jetted from the second holes 5b is preferably set to a desired direction within the range from the horizontal direction of the jet pipes 4 to the obliquely downward direction at 45 degrees with respect to the horizontal direction. The reason why the second direction C is set to the obliquely downward direction with respect to the horizontal direction is as follows. There are some cases where the carrier for holding plural target wafers 50 is disposed in a horizontal position, and if the chemical 40 is jetted in the horizontal direction in the above state, the chemical 40 may abut against the carrier, so that any chemical flow in the downward direction from the target wafers 50 cannot be formed. Further, the reason why the second direction C is set to the range from the horizontal direction to the obliquely downward direction at 45 degrees with respect to the horizontal direction is as follows. That is, if the second direction C is set to this range, the chemical 40 is expected to be jetted to the substantially center of the portion which is located below the jet pipes 5 and at which the chemical 40 is liable to stagnate.

The number of the second holes 5b formed in each jet pipe 4 is set to ⅓ or less of the number of the first holes 5a. If the number of the second holes 5b exceeds ⅓ of the number of the first holes 5a, the flow of the chemical 40 jetted from the second holes 5b may adversely affect the flow of the chemical 40 used to treat the surfaces of the target wafers 50, thereby reducing the uniformity of the etching, the cleaning effect, etc. However, the flow of the chemical 40 is formed at the lower side of the target wafers 50, and thus it is necessary that at least one second hole 5b is formed in each jet pipe 4.

In the first embodiment, five second holes 5b whose number is equal to ⅓ or less of the number (50) of the first holes 5a is formed in each jet pipe 4. As in the case of the first holes 5a, the diameter of each second hole 5b is preferably set to about 1.0 mm to 2.0 mm to obtain an excellent linear flow rate.

The third holes 5c are used to form flow of the chemical 40 just below each jet pipe 4, and the number of the third holes 5c is set to ⅕ or less of the number of the first holes 5a. If the number of the third holes 5c exceeds ⅕ of the number of the first holes 5a, the flow of the chemical 40 jetted from the third holes 5c may adversely affect the flow of the chemical 40 used to treat the surface of the target wafers 50, so that the etching uniformity, the cleaning effect, etc. are reduced. However, the flow of the chemical 40 is formed in the neighborhood of the bottom portion 2a of the treatment tank 2 which is located just below each jet pipe 4, and thus it is necessary that at least one third hole 5c is formed in each jet pipe 4.

In the first embodiment, five third holes 5c whose number is equal to ⅕ or less of the number of the first holes 5a are formed in each jet pipe 4. Further, as in the case of the first holes 5a, the diameter of each third hole 5c is preferably set to about 1.0 mm to 2.0 mm in order to obtain an excellent linear flow rate, for example.

The supply unit 6 is used to supply the chemical 40 to the jet pipes 4 so that the chemical 40 overflows from the treatment tank 2, and it comprises a pump 6a for circulating the chemical 40, and a filter 6b for filtering the chemical 40 from the pump 6a to remove the contaminant materials contained in the chemical 40. The outer tank 3 and the pump 6a are connected to each other through a pipe 6c, and the filter 6b and each jet pipe 4 are connected to each other through a pipe 6d.

In the chemical treatment apparatus 1 thus constructed, the chemical 40 is jetted from the jet pipes 4 in the first direction B, the second direction C and the third direction D while the chemical 40 in the treatment tank 2 overflows from the treatment tank 2 to the outer tank 3 in the direction indicated by an arrow A. The chemical 40 thus overflowed is successively supplied through the pipe 6c to the pump 6a and the filter 6b to be filtered and cleaned, then supplied to the jet pipes 4 through the pipe 6d, and then jetted from the jet pipes 4 into the treatment tank 2 again.

Next, the first embodiment of the chemical treatment method according to the present invention will be described on the basis of the chemical treatment method of the target wafer 50 using the above chemical treatment apparatus 1.

When the surface of the target wafer 50 is subjected to the chemical treatment, the chemical 40 is first filled in the treatment tank 2. Thereafter, the plural target wafers 50 accommodated in the carrier are dipped in the treatment 2 together with the carrier while the chemical 40 is jetted from each jet pipe and also the chemical 40 is overflowed from the treatment tank 2, thereby performing the chemical treatment on the surface of each target wafer 50.

When the chemical 40 is jetted, the chemical 40 is jetted from the first jet holes 5a, the second jet holes 5b and the third jet holes 5c , whereby the flow of the chemical 40 in the first direction B is formed between the target wafers 50 and between each target wafer 50 and the side wall portion 2b of the treatment tank 2, the flow of the chemical 40 in the second direction C (directing to the lower side of the target wafers 50) is formed, and the flow of the chemical 40 in the third direction D (directing to the lower side of the jet pipes 4) is formed. After a predetermined time period elapses, the carrier is fed out from the treatment tank 2 to feed the target wafers to a treatment area in a next step.

In the chemical treatment apparatus 1 using the above method, the jet pipes 4 contain not only the first jetting holes 5a for jetting the chemical 40 in the first direction B as in the case of the conventional apparatus, but also the second jetting holes 5b for jetting the chemical 40 in the second direction C (to the lower side of the target wafers 50) and the third jetting holes 5c for jetting the chemical 40 in the third direction D (to the substantially just lower side of the jet pipes 4).

Therefore, by jetting the chemical 40 from the first jetting holes 5a, the second jetting holes 5b and the third jetting holes 5c when the target wafers 50 are subjected to the chemical treatment, the flow of the chemical 40 can be formed between the target wafers 50 and between each target wafer 50 and the side wall 2b of the treatment tank 2, and also the flow of the chemical 40 can be formed in the neighborhood of the bottom portion 2a of the treatment tank 2 at the lower side of the target wafers 50 and in the neighborhood of the bottom portion 2a of the treatment tank 2 just below the jet pipes 4. The flow of the chemical 40 formed in the neighborhood of the bottom portion 2a abuts against the bottom portion 2a of the treatment tank 2 and the side wall portion 2b, so that the chemical 40 flows in the direction to the upper side of the treatment tank 2.

Accordingly, even when a part of the chemical 40 jetted from the jet pipes 4 returns from the upper side of the target wafers 50 to the jet pipes 4 by convection, the chemical 40 thus returning flows together with the flow of the chemical 40 formed in the bottom portion 2a of the treatment tank 2, so that the chemical 40 returning to the vicinity of the jet pipes 4 can be prevented from stagnating at the bottom portion 2a side of the treatment tank 2. As a result, a stagnant layer can be prevented from being formed at the bottom portion 2a side, and the chemical 40 can be efficiently circulated in the treatment tank 2.

FIG. 3 shows a result obtained in a wet etching treatment of the target wafer 50 when a thermal oxide film (having a diameter of 8 inches) on the surface of the target wafer 50 was subjected to wet etching with the chemical 40 formed of rare hydrofluoric acid of 0.5 wt %, then subjected to a water washing treatment and finally dried by a spin drier. As a comparison example, a result obtained by performing the same treatment on the target wafer 50 with the conventional chemical treatment apparatus 50 shown in FIG. 1 is also shown in FIG. 3. In the conventional chemical treatment apparatus 30, the jetting direction of the chemical 40 from the jetting holes 36 is the same as the first direction B of the first jetting holes 5a of the chemical treatment apparatus 1 of the first embodiment.

As shown in FIG. 3, it is apparent that when the chemical treatment apparatus 1 is used, the in-plane etching uniformity (3σ/average value (Ave.)) of the target wafer 50 is more greatly enhanced by about 1% or more than that of the conventional chemical treatment apparatus 30. Accordingly, it is apparent that the chemical 40 is efficiently circulated in the treatment tank 2 of the chemical treatment apparatus 1. Further, it was also visually experimentally confirmed that no stagnant layer existed at the bottom portion 2a of the treatment tank 2.

As is apparent from the above result, according to the chemical treatment apparatus 1, the chemical 40 can be efficiently circulated without forming any stagnant layer in the treatment tank 2. Therefore, a sufficient amount of chemical 40 can be supplied to the overall surface of the target wafer 50, and thus the in-plane etching uniformity of the target wafer 50 can be enhanced when the chemical treatment is the wet etching treatment. Further, when the chemical treatment is the cleaning treatment, the overall surface of the target wafer 50 can be sufficiently and uniformly cleaned. In addition, the contaminant materials in the chemical 40 can be greatly suppressed from adhering to the surface of the target wafer 50 again.

Since no stagnant layer is formed, it is unnecessary to frequently perform the work of cleaning the treatment tank 2, so that the working labor can be reduced, and also it is expected that the lifetime of the chemical 40 being used is lengthened. Further, the cost of the chemical 40 can be reduced because the lifetime of the chemical 40 is lengthened, and much attention can be paid to environmental pollution because the total use amount of the chemical 40 is reduced. Further, it is unnecessary to frequently perform the cleaning work of the treatment tank 2 and the exchange work of the chemical 40, so that the workability of the chemical treatment apparatus 1 can be enhanced and the manufacturing yield can be enhanced.

According to the chemical treatment method according to the first embodiment, when the chemical treatment is performed on the target wafer 50 by using the above chemical treatment apparatus 1, the flow of the chemical 40 is formed between the target wafers 50 and between each target wafer 50 and the side wall 2b of the treatment tank 2, and also the flow of the chemical 40 is formed in the neighborhood of the bottom portion 2a of the treatment tank 2 at the lower side of the target wafers 50 and in the neighborhood of the bottom portion 2a of the treatment tank 2 just below the jet pipes 4, so that the target wafers 50 can be treated with the chemical 40 which is efficiently circulated without forming any stagnant layer in the treatment tank 2. Accordingly the same effect as the above-described chemical treatment apparatus 1 can be obtained.

Accordingly, according to the chemical treatment apparatus 1 and the chemical treatment method of the first embodiment, the chemical treatment process having the stable chemical treatment effect on the target wafers 50 can be performed, thereby enhancing the electrical reliability and the manufacturing yield of semiconductor devices manufactured by using the target wafers 50.

Next, a second embodiment of the chemical treatment apparatus according to the present invention will be described with reference to FIG. 4. In FIG. 4, the same elements as the chemical treatment apparatus 1 of the first embodiment are represented by the same reference numerals, and the description thereof is omitted from the following description.

The difference of the chemical treatment apparatus 11 of the second embodiment from the chemical treatment apparatus 1 of the first embodiment resides in the connection state of the pair of jet pipes 4 and the supply unit 6. That is, each of the pair of jet pipes 4 is connected to the pipe 6d (see FIG. 2A) of the supply unit 6 substantially at the center of the length direction of the jet pipe 4. Accordingly, the chemical 40 cleaned by the filter 6b is supplied from the substantial center position of the length direction of each jet pipe 4 through the pipe 6d into each jet pipe 4 as indicated by an arrow E of FIG. 4.

As described above, in the conventional chemical treatment apparatus 30 shown in FIG. 1A, the chemical 40 is supplied so as to flow from one end side of each jet pipe 35 through the center portion of the jet pipe 35 to the other end side of the jet pipe 35, so that the jet amount of the chemical 40 jetted from the jetting holes 36 of the jet pipes 35 into the treatment tank 2 is varied between the one end side of each jet pipe 35 having higher flow-in pressure and the other end side of the jet pipe 35. Therefore, the chemical treatment condition is varied between a target wafer 50 disposed at the one end side of the jet pipe 35 and another target wafer 50 disposed at the other end side of the jet pipe 35, and thus there occurs some dispersion in chemical treatment effect between the target wafers 50.

On the other hand, in the chemical treatment apparatus 11 of the second embodiment, the chemical 40 is supplied so as to flow into each jet pipe 4 from the substantially center position of the length direction of the jet pipe 4, so that the flow-in pressure of the chemical 40 into the jet pipe 4 is equally divided into the right and left sides. As a result, the dispersion of the jet amount of the chemical 40 which is jetted into the treatment tank 2 from each of the first jetting holes 36 formed along the length direction of the jet pipe 4 is more moderated as compared with the conventional chemical treatment apparatus 11. Accordingly, when the chemical treatment is performed by using the chemical treatment apparatus 11, the chemical 40 is supplied to each jet pipe 4 while it is jetted from the first jetting holes 5a, the second jetting holes 5b and the third jetting holes 5c of each jet pipe 4, whereby the plural target wafers 50 can be treated with suppressing the dispersion of the treatment condition between the target wafers 50.

Accordingly, according to the chemical treatment apparatus 11 of this embodiment, the chemical treatment process can be performed with not only the effect of the chemical treatment apparatus 1 of the first embodiment, but also the effect of suppressing the dispersion of the treatment effect between the target wafers 50. Further, the second embodiment of the chemical treatment method according to the present invention relates to the method of supplying the chemical 40 to the jet pipes 4 while jetting the chemical 40 from each first jetting hole 5a, each second jetting hole 5b and each third jetting hole 5c of each jet pipe 4 by using the chemical treatment apparatus 11, thereby applying the chemical treatment to the target wafers 50. Therefore, the same effect as the chemical treatment apparatus 11 can be obtained by the chemical treatment method of the second embodiment.

Next, a third embodiment of the chemical treatment apparatus of the present invention will be described with reference to FIG. 5 which is a plan view of the main part of the chemical treatment apparatus of the third embodiment. In FIG. 5, the same elements as the chemical treatment apparatus 1 of the first embodiment are represented by the same reference numerals, and the description thereof is omitted.

The difference of the chemical treatment apparatus 21 of the third embodiment from the chemical treatment apparatus 1 of the first embodiment resides in the formation state of the pair of jet pipes 4 and the connection state between the jet pipes 4 and the supply unit 6.

That is, the pair of jet pipes 4 are connected to each other so that one end portions thereof are connected to each other through a link pipe 7 and the other end portions thereof are connected to each other through another link pipe 7. At least one of the link pipes 7 for connecting the one end portions and the other end portions of the jet pipes 4 respectively is connected to the pipe 6d (see FIG. 2A) of the supply unit 6 at the substantially center position of the length direction of the link pipe 7 concerned. Accordingly, the chemical 40 cleaned by the filter 6b flows from the substantial center of the length direction of the link pipe 7 through the pipe 6d into the link pipe 7 as indicated by an arrow F of FIG. 5, and is supplied to each jet pipe 4.

In the chemical treatment apparatus 21 of the third embodiment thus constructed, the pair of jet pipes 4 are linked to the link pipes 7 to form a ring member 8, and the chemical 40 flows from the substantial center of the length direction of the link pipe 7 into the ring member 8. Therefore, when the chemical 40 is made to flow from the link pipe 7 while the chemical 40 is filled in the ring member 8, the flow-in pressure of the chemical 40 is uniformly applied at any position in the length direction of the pair of jet pipes 4. As a result, the dispersion of the jet amount of the chemical 40 which is jetted from each first jet hole 36 formed along the length direction of the jet pipes 4 into the treatment layer can be suppressed to the minimum level.

Accordingly, when the chemical treatment using the chemical treatment apparatus 21 is performed, the chemical 40 is supplied to the jet pipes 4 through the link pipe(s) 7 while the chemical 40 is jet from each first jetting hole 5a, each second jetting hole 5b and each third jetting hole 5c of each jet pipe 4, whereby the dispersion of the chemical treatment condition between the target wafers 50 can be greatly suppressed. Therefore, according to the chemical treatment apparatus 21 of the third embodiment, not only the effect of the chemical treatment apparatus 1 of the first embodiment can be obtained, but also the dispersion of the treatment effect between the target wafers 50 can be minimized, so that the stable chemical treatment process can be performed.

Further, the third embodiment of the chemical treatment method of the present invention relates to the method of supplying the chemical 40 through the link pipe(s) 7 to the jet pipes 4 while jetting the chemical 40 from each first jetting hole 5a, each second jetting hole 5b and each third jetting hole 5c of each jet pipe 4 by using the chemical treatment apparatus 21, thereby performing the chemical treatment on the target wafers 50. Therefore, the same effect as the chemical treatment apparatus 21 can be also obtained by the chemical treatment method of the third embodiment.

The chemical treatment apparatus and the chemical treatment method of the present invention are not limited to the first to third embodiments. For example, the jetting holes of each jet pipe may be constructed by first holes for jetting the chemical upwardly and second holes for jetting the chemical in a direction different from that of the first holes. Further, when the target wafers are treated, the chemical may be jetted in two directions, that is, in the direction to the substantial centers of the target wafers and in a direction different from the above direction. Still further, the chemical treatment conditions such as the number of the jetting holes, the diameter of the jetting holes, etc. may be suitably changed without departing from the subject matter of the present invention, and it is needless to say that the present invention is applicable to various chemical treatments.

According to the chemical treatment apparatus of the present invention, the etching uniformity when the wet etching is performed can be remarkably enhanced, and also the overall surface of the target wafer can be uniformly and sufficiently cleaned when the cleaning treatment is performed, so that the stable chemical treatment can be performed. Further, the contaminant materials in the chemical can be greatly suppressed from adhering to the surface of the target wafer again. In addition, since no stagnant layer is formed, the labor needed to clean the treatment tank and exchange the chemical can be greatly reduced. Further, the lifetime of the chemical being used is expected to be lengthened, and the cost can be reduced because of the long lifetime of the chemical and much attention can be paid to the environmental pollution because the total use amount of the chemical is reduced.

According to the chemical treatment method of the present invention, when the target wafer is treated, the chemical is jetted from at least the two directions, that is, the first direction to the target wafer and the second direction which is different from the first direction. Therefore, if the second direction is set to the direction in which the chemical is jetted to the bottom side of the treatment tank, the target wafers can be treated with the chemical which efficiently flows in the treatment tank without forming any stagnant layer at the bottom portion of the treatment tank. Accordingly, the same effect as the chemical treatment apparatus as described above can be obtained. positions in the length direction of each of said jet pipes, and the chemical is supplied from the substantially center position in the length direction of at least of said link pipe for connecting the one end portions of said jet pipes and said link pipe for connecting the other end portions of said jet pipes.

What is claimed is:

1. A chemical treatment apparatus comprising:
   a treatment tank having a bottom portion;
   a first jet pipe having a transverse axis;
   a plurality of first jetting holes formed along said first jet pipe, said first jetting holes positioned to jet fluid flowing in said first jet pipe in an upward direction relative to the transverse axis; and
   a plurality of second jetting holes formed along said first jet pipe, said second jetting holes positioned to jet the fluid in a second direction different from the upward direction,
   wherein the upward direction is toward a substrate positioned in said treatment tank and said second direction is not toward the substrate.

2. A chemical treatment apparatus according to claim 1, wherein the second direction is a predetermined direction within a range from horizontal with respect to the transverse axis to obliquely downward at 45 degrees with respect to the transverse axes.

3. A chemical treatment apparatus according to claim 1, wherein the plurality of first jetting holes is set to a predetermined number, the predetermined number being larger than a number of wafers simultaneously dipped in said treatment tank.

4. A chemical treatment apparatus according to claim 3, wherein the plurality of second jetting holes is ⅓, or less, of said first jetting holes.

5. A chemical treatment apparatus according to claim 1, further comprising:
   a plurality of third jetting holes formed along said first jet pipe, said third jetting holes positioned to jet the fluid toward the bottom portion of said treatment tank.

6. A chemical treatment apparatus according to claim 5, wherein the second direction is a predetermined direction within a range from horizontal with respect to the transverse axis to obliquely downward at 45 degrees with respect to the transverse axes.

7. A chemical treatment apparatus according to claim 5, wherein the plurality of first jetting holes is set to a predetermined number, the predetermined number being larger than a number of wafers simultaneously dipped in said treatment tank.

8. A chemical treatment apparatus according to claim 7, wherein the plurality of second jetting holes is ⅓, or less, of said first jetting holes.

9. A chemical treatment apparatus according to claim 7, wherein the plurality of third holes formed along said first jet pipe is ⅕, or less, of said first jetting holes.

10. A chemical treatment apparatus according to claim 1, further comprising:
    a second jet pipe positioned parallel to said first jet pipe, said second jet pipe having a transverse axis and including a plurality of said first and said second jetting holes therein,
    wherein said first jetting holes of said first jet pipe are positioned to jet the fluid both upwardly and in a direction toward said second jet pipe, and said first jetting holes of said second jet pipe are positioned to jet the fluid both upwardly and in a direction toward said first jet pipe.

11. A chemical treatment apparatus according to claim 10, wherein the second direction is a predetermined direction within a range from horizontal with respect to the transverse axis to obliquely downward at 45 degrees with respect to the transverse axes.

12. A chemical treatment apparatus according to claim 10, wherein the plurality of first jetting holes is set to a predetermined number, the predetermined number being larger than a number of wafers simultaneously dipped in said treatment tank.

13. A chemical treatment apparatus according to claim 12, wherein the plurality of second jetting holes is ⅓, or less, of said first jetting holes.

14. A chemical treatment apparatus according to claim 10, further comprising:
    a plurality of third jetting holes formed along said first and second jet pipes, said third jetting holes positioned to jet the fluid toward the bottom of said treatment tank.

15. A chemical treatment apparatus according to claim 14, wherein the second direction is a predetermined direction within a range from horizontal with respect to the transverse axis to obliquely downward at 45 degrees with respect to the transverse axes.

16. A chemical treatment apparatus according to claim 14, wherein the plurality of first jetting holes is set to a predetermined number, the predetermined number being larger than a number of wafers simultaneously dipped in said treatment tank.

17. A chemical treatment apparatus according to claim 16, wherein the plurality of second jetting holes is ⅓, or less, of said first jetting holes.

18. A chemical treatment apparatus according to claim 16, wherein the plurality of third holes formed along each of said first and second pipes is ⅕, or less, of said first jetting holes.

19. A chemical treatment apparatus according to claim 10, further comprising:
    a supply conduit connected to each of said first and second jet pipes at a substantially center position in a length direction of each of said pipes.

20. A chemical treatment apparatus according to claim 19, wherein the second direction is a predetermined direction within a range from horizontal with respect to the transverse axis to obliquely downward at 45 degrees with respect to the transverse axes.

21. A chemical treatment apparatus according to claim 19, wherein the plurality of first jetting holes is set to a predetermined number, the predetermined number being larger than a number of wafers simultaneously dipped in said treatment tank.

22. A chemical treatment apparatus according to claim 21, wherein the plurality of second jetting holes is ⅓, or less, of said first jetting holes.

23. A chemical treatment apparatus according to claim 19, further comprising:
    a plurality of third jetting holes formed along said first and second jet pipes, said third jetting holes positioned to jet the fluid toward the bottom of said treatment tank.

24. A chemical treatment apparatus according to claim 23, wherein the second direction is a predetermined direction within a range from horizontal with respect to the transverse axis to obliquely downward at 45 degrees with respect to the transverse axes.

25. A chemical treatment apparatus according to claim 23, wherein the plurality of first jetting holes is set to a predetermined number, the predetermined number being larger than a number of wafers simultaneously dipped in said treatment tank.

26. A chemical treatment apparatus according to claim 25, wherein the plurality of second jetting holes is 1/3, or less, of said first jetting holes.

27. A chemical treatment apparatus according to claim 25, wherein the plurality of third holes formed along each of said first and second pipes is 1/5, or less, of said first jetting holes.

28. A chemical treatment apparatus according to claim 10, further comprising:

a first link pipe interconnecting first ends of said first and second jet pipes;

a second link pipe interconnecting second ends of said first and second jet pipes; and a supply conduit connected to at least one of said first and second link pipes at a substantially center position in a length direction of said link pipes.

29. A chemical treatment apparatus according to claim 28, wherein the second direction is a predetermined direction within a range from horizontal with respect to the transverse axis to obliquely downward at 45 degrees with respect to the transverse axes.

30. A chemical treatment apparatus according to claim 28, wherein the plurality of first jetting holes is set to a predetermined number, the predetermined number being larger than a number of wafers simultaneously dipped in said treatment tank.

31. A chemical treatment apparatus according to claim 30, wherein the plurality of second jetting holes is 1/3, or less, of said first jetting holes.

32. A chemical treatment apparatus according to claim 28, further comprising:

a plurality of third jetting holes formed along said first and second jet pipes, said third jetting holes positioned to jet the fluid toward the bottom of said treatment tank.

33. A chemical treatment apparatus according to claim 32, wherein the second direction is a predetermined direction within a range from horizontal with respect to the transverse axis to obliquely downward at 45 degrees with respect to the transverse axes.

34. A chemical treatment apparatus according to claim 32, wherein the plurality of first jetting holes is set to a predetermined number, the predetermined number being larger than a number of wafers simultaneously dipped in said treatment tank.

35. A chemical treatment apparatus according to claim 34, wherein the plurality of second jetting holes is 1/3, or less, of said first jetting holes.

36. A chemical treatment apparatus according to claim 34, wherein the plurality of third holes formed along each of said first and second pipes is 1/5, or less, of said first jetting holes.

37. A chemical treatment apparatus for treating wafers from a lower side, comprising:

tank means for receiving a chemical, the chemical filling said tank means; and jetting means for jetting the chemical in at least first and second directions from the lower side while the wafers are dipped into the chemical filling said tank means, wherein the first direction is toward the wafers, and the second direction is a direction not toward the wafers.

38. A chemical treatment apparatus for treating wafers from a lower side according to claim 37, wherein:

said jetting means comprises first and second jet pipe means positioned parallel to each other and proximate a bottom of said tank means, said first and second jet pipe means each having a transverse axis;

the second direction being an obliquely downward direction with respect to the transverse axes; and said jetting means further jets the chemical in a third direction, the third direction being toward the bottom of said tank means.

39. A chemical treatment apparatus for treating wafers from a lower side according to claim 38, wherein the second direction is a predetermined direction within a range from horizontal with respect to the transverse axes to obliquely downward at 45 degrees with respect to the transverse axes.

40. A chemical treatment apparatus for treating wafers from a lower side according to claim 38, further comprising:

supply means for supplying the chemical to said first and second jet pipe means, said supply means being connected to a substantially center position in a length direction of each of said first and second jet pipe means, wherein the chemical is jetted in the first direction at plural positions along the length direction of said first and second jet pipe means.

41. A chemical treatment apparatus for treating wafers from a lower side according to claim 38, further comprising:

first link means for interconnecting first ends of said first and second jet pipe means;

second link means interconnecting second ends of said first and second jet pipe means; and supply supply means connected to at least one of said first and second link pipe means at a substantially center position in a length direction of said link pipe means.

* * * * *